(12) United States Patent
Tsai et al.

(10) Patent No.: US 11,131,025 B2
(45) Date of Patent: *Sep. 28, 2021

(54) WIRELESS CAMERA WAFER FOR VACUUM CHAMBER DIAGNOSTICS

(71) Applicant: Taiwan Semiconductor Manufacturing Co., Ltd., Hsin-Chu (TW)

(72) Inventors: Tzu-Chung Tsai, Hsinchu County (TW); Chii-Ming Wu, Taipei (TW); Hai-Dang Trinh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/907,714

(22) Filed: Jun. 22, 2020

(65) Prior Publication Data

US 2021/0005487 A1    Jan. 7, 2021

Related U.S. Application Data

(63) Continuation of application No. 16/458,276, filed on Jul. 1, 2019, now Pat. No. 10,748,798.

(51) Int. Cl.
| | |
|---|---|
| *C23C 16/52* | (2006.01) |
| *H01L 21/67* | (2006.01) |
| *H04N 5/232* | (2006.01) |
| *C23C 16/455* | (2006.01) |
| *C23C 14/34* | (2006.01) |

(Continued)

(52) U.S. Cl.
CPC .......... *C23C 16/52* (2013.01); *C23C 14/3407* (2013.01); *C23C 14/52* (2013.01); *C23C 14/54* (2013.01); *C23C 16/45565* (2013.01); *G06T 7/0004* (2013.01); *H01L 21/67253* (2013.01); *H04N 5/23203* (2013.01); *G06T 7/80* (2017.01); *G06T 2207/30148* (2013.01); *H01L 21/67288* (2013.01)

(58) Field of Classification Search
None
See application file for complete search history.

(56) References Cited

U.S. PATENT DOCUMENTS

| | | | |
|---|---|---|---|
| 10,748,798 B1 * | 8/2020 | Tsai | ........................ C23C 14/54 |
| 2006/0000964 A1 | 1/2006 | Ye et al. | |

OTHER PUBLICATIONS

Wikipedia.org. "Chemical vapor deposition." Published on Feb. 15, 2019.

(Continued)

*Primary Examiner* — Michelle M Iacoletti
(74) *Attorney, Agent, or Firm* — Eschweiler & Potashnik, LLC

(57) ABSTRACT

In some embodiments, the present disclosure relates to a process tool which includes a housing that defines a vacuum chamber. A wafer chuck is in the housing, and a carrier wafer is on the wafer chuck. A structure that is used for deposition processes is arranged at a top of the housing. A camera is integrated on the wafer chuck such that the camera faces a top of the housing. The camera is configured to wirelessly capture images of the structure used for deposition processes within the housing. Outside of the housing is a wireless receiver. The wireless receiver is configured to receive the images from the camera while the vacuum chamber is sealed.

20 Claims, 16 Drawing Sheets

(51) Int. Cl.
*G06T 7/00* (2017.01)
*C23C 14/54* (2006.01)
*C23C 14/52* (2006.01)
*G06T 7/80* (2017.01)

(56) References Cited

OTHER PUBLICATIONS

Kadambi et al. "Rethinking Machine Vision Time of Flight With GHz Heterodyning." IEEE Access, vol. 5, published on Nov. 17, 2017.
Kaltbrunner Top Coatings. "PVD Technology." The date of publication is unknown. Retrieved online on Apr. 25, 2019 from https://www.kaltbrunner.ch/en/Technologie/PVD-Verfahren.
Society of Vacuum Coaters. "PVD Processes: Pulsed DC for Sputtering & Biasing." Published May 2000.
Merck KG. "Physical Vapor Deposition (PVD)." Published Oct. 2011.
Dobkin, Daniel. "Showerhead Reactors: Overview." Published in 2016.
Wikipedia.org "Time-of-Flight Camera." Published Apr. 2, 2019.
Schoff, Michael Elliott. "Sputter Target Erosion and Its Effects on Long Duration DC Magnetron Sputter Coating." University of California, San Diego. Published Jun. 2009.
Herring, Dan. "Vacuum Deposition Processes." VAC AERO, published Aug. 10, 2015.
University of Michigan. "Visual Encyclopedia of Chemical Engineering: Chemical Vapor Deposition Reactors." The date of publication is unknown. Retrieved online on Apr. 25, 2019 from http://encyclopedia.che.engin.umich.edu/Pages/Reactors/CVDReactors/CVDReactors.html.
Non-Final Office Action dated Jan. 6, 2020 for U.S. Appl. No. 16/458,276.
Notice of Allowance dated Apr. 13, 2020 for U.S. Appl. No. 16/458,276.

* cited by examiner

WIRELESS CAMERA WAFER FOR VACUUM CHAMBER DIAGNOSTICS

REFERENCE TO RELATED APPLICATION

This application is a Continuation of U.S. application Ser. No. 16/458,276, filed on Jul. 1, 2019, the contents of which are hereby incorporated by reference in their entirety.

BACKGROUND

Semiconductor device fabrication is a process used to create integrated circuits that are present in everyday electronic devices. The fabrication process is a multiple-step sequence comprising deposition, photolithographic, and chemical processing steps during which electronic circuits are gradually created on a wafer. During deposition steps, the wafer may be loaded into a chamber housing and a thin film of material may be deposited onto the wafer. The chamber housing may define a vacuum chamber that provides a controlled environment that facilitates uniform deposition, thereby producing a substantially reliable thin film onto the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
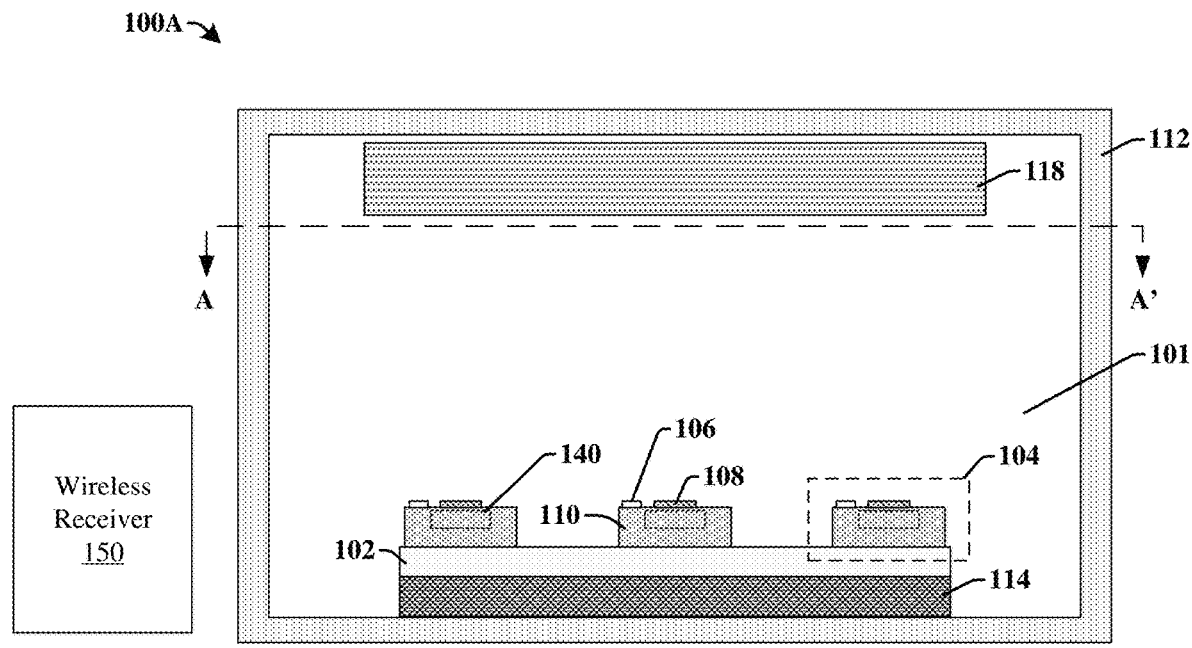
FIGS. 1A, 1B and 1C illustrate a cross-sectional view, a top-view, and a perspective view, respectively, of some embodiments of a process tool having a camera in a vacuum chamber.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During semiconductor fabrication, deposition of a new material onto a wafer may be conducted, for example, via chemical vapor deposition (CVD) or physical vapor deposition (PVD). CVD utilizes chemical reaction and/or decomposition of one or more precursors on a wafer surface to deposit a film onto the wafer surface. On the other hand, PVD does not use a chemical reaction and/or decomposition of one or more precursors. Instead, a material to be deposited vaporizes and then condenses on a wafer surface to deposit a film onto the wafer surface. In both CVD and PVD, a controlled environment is used to produce a uniform film over the wafer. In many embodiments, the controlled environment is achieved by loading the wafer into a vacuum housing that defines a vacuum chamber. Vacuum conditions may change the surface energy of the wafer to be more suitable for deposition, provide a low-pressure environment for deposition, and reduce the temperature needed to facilitate the deposition.

Over time, defects may occur in structures in a vacuum chamber. In some CVD processes, for example, a shower head, comprising multiple pores as precursor outputs, sprays the precursor(s) into the vacuum chamber. The precursor(s) chemically react and/or decompose to deposit a film on a wafer. Over time, portions of the shower head get clogged or comprise unwanted residue, whereby the deposited film may have contaminants in it or to be non-uniform in thickness over the wafer. In PVD processes, for example, a target may be arranged over a wafer. The material of the target (e.g., target material) may be deposited onto the wafer upon, in part, bombardment by a gas. Over time, the target may become defective. Target defects may include, for example, erosion, peeling, and/or cracking. Target defects may, for example, lead to arcing and/or other failure conditions. Further, if the target comprises a defective profile, the deposited film over the wafer may be defective too. For example, the deposited film may be thicker in some areas on the wafer than others. Thus, in order to prevent and/or detect defective structures in a vacuum chamber, the vacuum chamber should be monitored. However, because a vacuum housing is sealed when under operating conditions (e.g., vacuum, temperature, and/or pressure conditions), it is difficult to monitor the vacuum chamber.

Various embodiments of the present disclosure provide a process tool and method for monitoring a vacuum chamber when under operating conditions. In some embodiments, a wafer comprising a camera is loaded into a vacuum housing that defines a vacuum chamber. The camera faces an upper portion of the vacuum chamber. The vacuum housing is then sealed and the vacuum chamber is put under vacuum conditions and/or other operating conditions such as pressure or temperature conditions. The cameras then wirelessly capture image data of the vacuum chamber while under the operating conditions. A wireless receiver that is outside of the vacuum housing is configured to wirelessly receive and process the image data taken from the camera. In some embodiments, the camera is a time of flight (ToF) camera that is used to determine a 3D image profile of an object of interest in the vacuum chamber based on the time it takes for radiation emitted from the ToF camera to reflect off the object of interest and return to the ToF camera. In other embodiments, the camera may be a complementary metal oxide semiconductor (CMOS) image sensor, such as those found in cell phones, that captures a 2D image of the object of interest. The object of interest may, for example, be a PVD target, a CVD showerhead, or some other suitable structure in the vacuum chamber.

Thus, the aforementioned method may be used in process tools that comprise a vacuum chamber (e.g., PVD chambers, CVD chambers, etching chambers, annealing chambers, implant chambers, furnace chambers, etc.) such that defects in the vacuum chamber may be mitigated. This, in turn, allows enhanced yields and production of more reliable devices (e.g., devices having a high wafer acceptance test performance). For example, in some embodiments, the aforementioned method is used to perform routine checks of a vacuum housing. For example, in some embodiments, a first wafer may undergo a process (e.g., CVD, PVD, etching, annealing, implantation, etc.) within the vacuum chamber under operating conditions. After the first wafer is removed from the vacuum chamber, a second wafer comprising the camera may be loaded into the vacuum chamber to determine conditions of an object of interest within the vacuum chamber under the operating conditions to diagnose any defects within the vacuum chamber. When defects are detected early in a vacuum housing, the cause for the defect may be identified, fixed, and prevented in the future.

FIG. 1A illustrates a cross-sectional view 100A of some embodiments of a process tool comprising a camera integrated on a carrier wafer within a vacuum housing to wirelessly capture 2D images within the vacuum housing.

The process tool includes a vacuum housing 112 that defines a vacuum chamber 101. In some embodiments, a wafer chuck 114 is within the vacuum chamber 101 and over a lower portion of the vacuum housing 112. The wafer chuck 114 is configured to hold a carrier wafer 102. In some embodiments, the wafer chuck 114 is an electrostatic chuck which uses a first voltage bias to electrostatically hold onto the carrier wafer 102 and a second voltage bias to release the carrier wafer 102. In some embodiments, an object of interest 118 may be arranged within the vacuum chamber 101 and near an upper portion of the vacuum housing 112. In some embodiments, the process tool may be used, for example, for physical vapor deposition (PVD). Therefore, the object of interest 118 may be a target, as in FIG. 3A, used for deposition of a film comprising material of the target. In other embodiments, the process tool may be used, for example, for chemical vapor deposition (CVD). Therefore, the object of interest 118 may be a shower head, as in FIG. 4A, comprising pores for the release of gases for deposition of a film. In yet other embodiments, the object of interest 118 may be any feature within the vacuum chamber 101 used for, for example, etching, annealing, implantation, or heating.

In some embodiments, the cameras 104 are integrated on a top surface of the carrier wafer 102. In some embodiments, the cameras 104 each comprise a lens 108 and an image sensor 140 on or within a camera housing 110. In some embodiments, the image sensor 140 underlies the lens 108 on each camera 104. In some embodiments, the lenses 108 may exhibit a rectangular shape from the cross-sectional view 100A, whereas in other embodiments, the lenses 108 may exhibit a circular or semi-circular shape from the cross-sectional view 100A. In some embodiments, the carrier wafer 102 is substantially flat on the wafer chuck 114 such that the lenses 108 have top surfaces that are substantially level, or co-planar, with one another. In some embodiments, the image sensors 140 are complementary metal oxide semiconductor (CMOS) image sensors, such as the CMOS image sensors used on cellular devices. In some embodiments, the cameras 104 further include a light source 106 such as a flash. In other embodiments, the cameras 104 do not comprise a light source 106. In such other embodiments, a separate light source may be integrated onto the carrier wafer 102 and spaced apart from the camera housing 110, or a separate light source may be coupled to the vacuum housing 112 within the vacuum chamber 101. In some embodiments, the carrier wafer 102 and the cameras 104 are configured such that the lens 108 of each camera 104 faces a desired feature to be captured that is within the vacuum housing 112. For example, in some embodiments, the condition of the object of interest 118 is monitored, and thus, the lens 108 of each camera 104 faces and directly underlies the object of interest 118.

In some embodiments, the number of cameras 104 integrated onto the carrier wafer 102 is dependent on whether the size of the object of interest 118 to be captured is too large for one camera 104. For example, in some embodiments, only one camera 104 is integrated onto the carrier wafer 102, whereas in other embodiments, multiple cameras 104 are integrated onto the carrier wafer 102. The cameras 104 are each configured to wirelessly capture image data from inside the vacuum housing 112 using the lens 108, and to wirelessly send the image data to a wireless receiver 150 outside of the vacuum housing 112. The image data may then be used to determine the condition of the object of interest 118 inside of the vacuum housing 112 while operating conditions (e.g., vacuum conditions, temperature conditions, pressure conditions, etc.) are present. The cameras 104 capture and send image data wirelessly because the vacuum housing 112 is closed and vacuum sealed to achieve the operating conditions.

In some embodiments, the vacuum chamber 101 is dark, so the light source 106 is configured to activate while the cameras 104 capture image data. The wireless receiver 150 is configured to process image data from the cameras 104 to determine and/or display a final image. For example, if multiple cameras 104 are used, the wireless receiver 150 may use a software to compile and overlap the multiple images from image data to determine and/or display a final image, which in some embodiments, may comprise a 2D image of the object of interest 118 under operating conditions. The operating conditions may influence the 2D image of the object of interest 118. For example, the object of interest 118 may exhibit different defects/characteristics when under the temperature conditions in the vacuum chamber 101 due to thermal expansion of the object of interest 118 at different temperatures. Further, for example, the object of interest 118 may exhibit different defects/characteristics under the vacuum conditions in the vacuum chamber 101 due to the different surface energy of the object of interest 118 under vacuum. Thus, by wirelessly capturing a 2D image of the object of interest 118 while under operating conditions within a vacuum chamber 101, defects of the object of interest 118 may be better diagnosed.

Figure 1B:
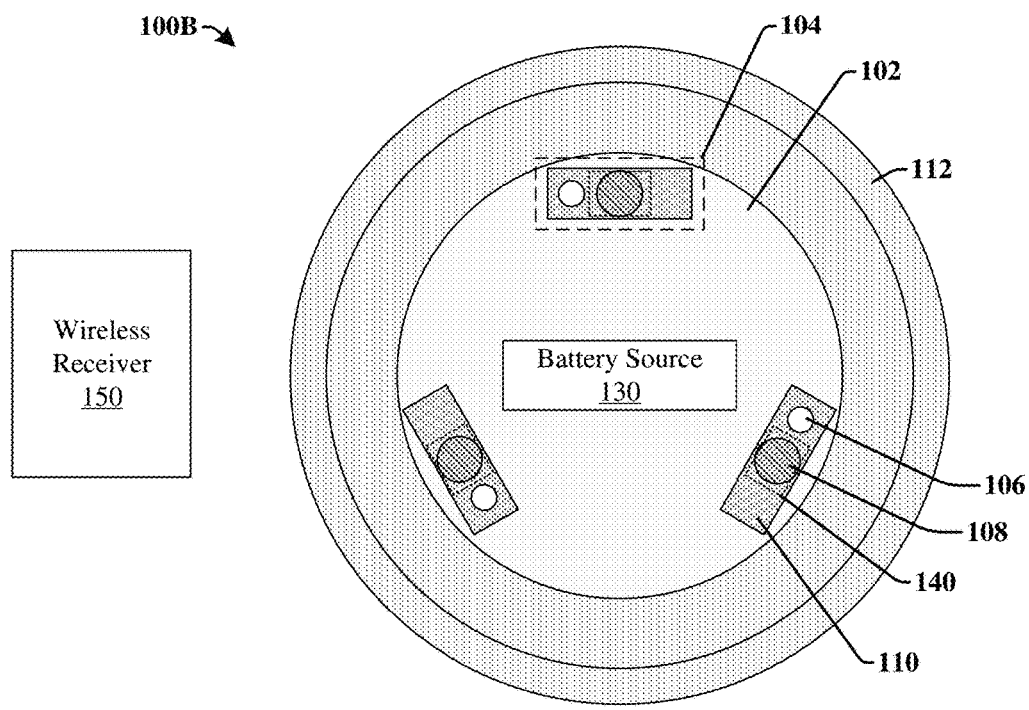

FIG. 1B illustrates a top-view 100B of some embodiments of a carrier wafer comprising cameras within a vacuum chamber. The top-view 100B of FIG. 1B corresponds to the cross-sectional view 100A of FIG. 1A along line AA'.

In some embodiments, a battery source 130 may be integrated on the carrier wafer 102 and may be configured to power the cameras 104. Thus, the battery source 130 may be coupled to the cameras 104. In some embodiments, each camera 104 is coupled to the same battery source 130, whereas in other embodiments, each camera 104 may have its own battery source 130.

In some embodiments, the cameras 104 are evenly spaced from a center of the carrier wafer 102 and evenly spaced apart from one another. In some embodiments, the cameras 104 may be closer to an edge of the carrier wafer 102 than to the center of the carrier wafer 102. In other embodiments, the cameras 104 may be closer to the center of the carrier wafer 102 than to the edge of the carrier wafer 102. In other embodiments, the cameras 104 may not be evenly spaced apart from one another or evenly spaced from the center of the carrier wafer 102. In some embodiments, only one camera 104 is on the carrier wafer 102 and is arranged in the center of the carrier wafer 102. In other embodiments, only one camera 104 is on the carrier wafer 102 and is arranged away from the center of the carrier wafer 102. Nevertheless, one or more cameras 104 are arranged on the carrier wafer 102 to wirelessly capture images of a desired feature within the vacuum housing 112 while under operating conditions. In some embodiments, from the top-view 100B, the lenses 108 and/or the light source 106 may exhibit a circular shape. In other embodiments, the lenses 108 and/or the light source 106 may exhibit a shape other than circular (e.g., rectangular, triangular, etc.).

Figure 1C:
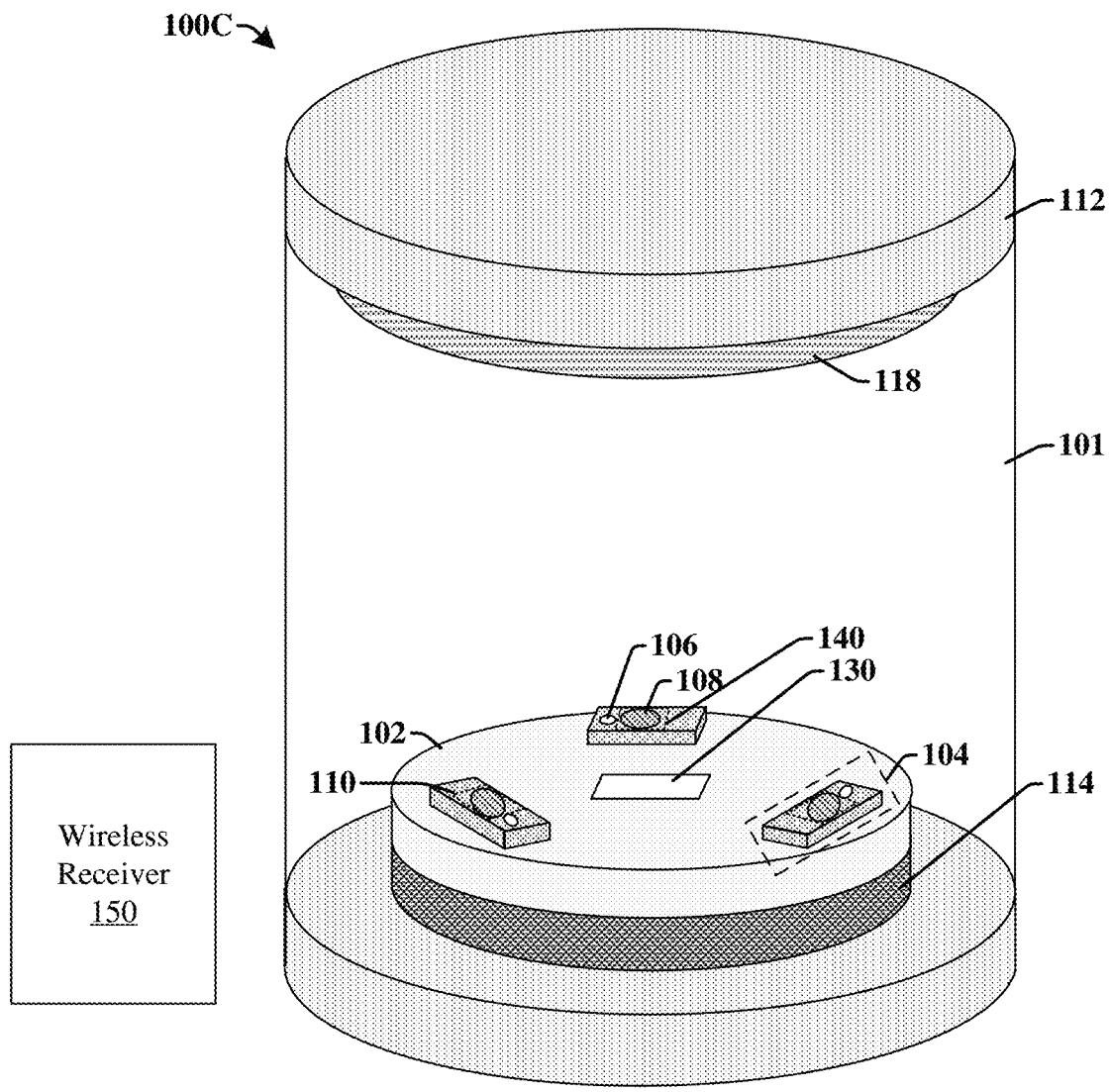

FIG. 1C illustrates a perspective view 100C of some embodiments of a carrier wafer comprising cameras within a vacuum chamber. The perspective view 100C corresponds to the cross-sectional view 100A of FIG. 1A.

In some embodiments, the wafer chuck 114 may be substantially centered on a bottom surface of the vacuum housing 112. Similarly, in some embodiments, the carrier wafer 102 may be centered beneath and directly underlie the object of interest 118. In some embodiments, the carrier wafer 102 may have a surface area less than, greater than, or equal to a surface area of the object of interest 118. In some embodiments, the thickness measured from a bottom surface of the carrier wafer 102 and a top surface of the camera 104 may be in a range of between approximately 5 millimeters and approximately 7 millimeters. For example, in some embodiments, the thickness measured from a bottom surface of the carrier wafer 102 and a top surface of the camera 104 may be about equal to that of a mobile phone, such as, for example, 6 millimeters. In some embodiments, the distance between the carrier wafer 102 and the object of interest 118 is dependent on parameters according to the process tool in use (e.g., CVD, PVD, etching chamber, furnace chamber, etc.). In some embodiments, the vacuum housing 112 is cylindrical, whereas in other embodiments, the vacuum housing 112 has some other suitable shape.

Figure 2A:
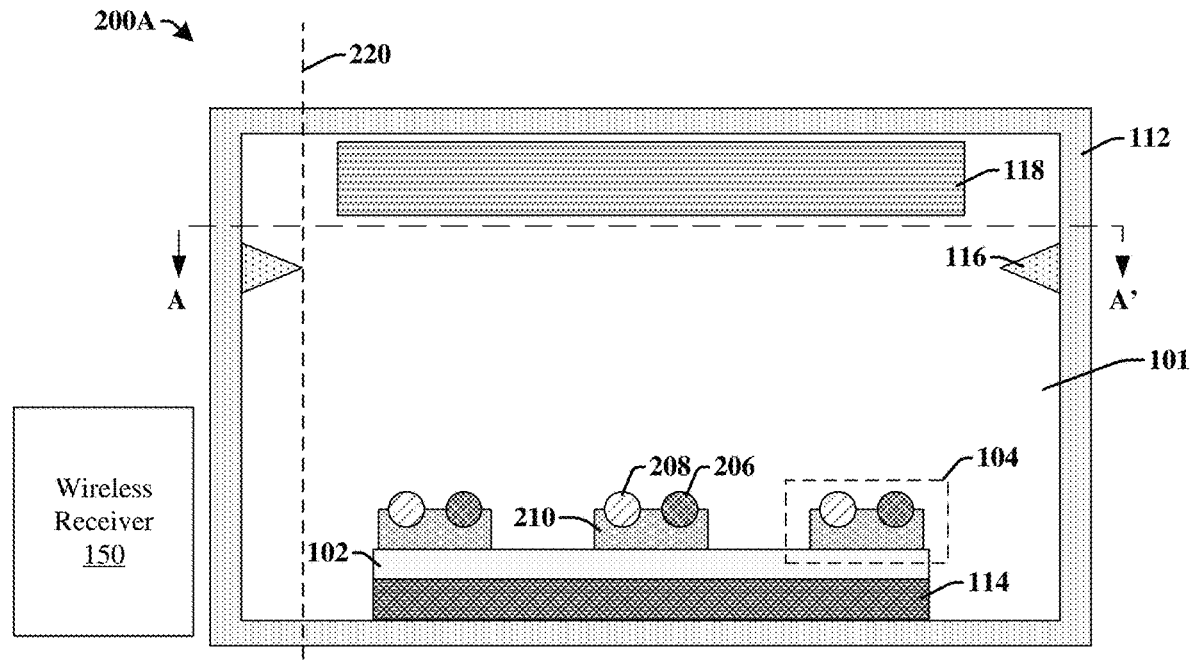
FIGS. 2A, 2B and 2C illustrate a cross-sectional view, a top-view, and a perspective view, respectively, of some additional embodiments of a process tool having a camera in a vacuum chamber with calibration markings.

FIG. 2A illustrates a cross-sectional view 200A of some embodiments of a process tool comprising a camera integrated on a carrier wafer within a vacuum housing to wirelessly capture 3D images within the vacuum housing.

The process tool in the cross-sectional view 200A of FIG. 2A includes similar features as the process tool in the cross-sectional view 100A of FIG. 1A. In some embodiments, the cameras 104 may be time of flight (ToF) cameras. In such embodiments, the cameras 104 may comprise a sensor 206 and an emitter 208 arranged in the camera housing 210. ToF cameras may provide resolutions of a micrometer or less. For example, in some embodiments, the cameras 104 may be ToF cameras that are 12 millimeters by 8 millimeters and have a 3 micrometer resolution. From the cross-sectional view 200A, the emitter 208 and the sensor 206 may, for example, exhibit a circular shape. The emitter 208 is configured to emit radiation towards an object of interest 118 and may, for example, be a laser or some other suitable emitter of radiation. The sensor 206 is configured to receive the radiation after the radiation reflects from the object of interest 118 and travels back to the camera 104. In some embodiments, the cameras 104 are calibrated before collecting data. Thus, in some embodiments, calibration markings 116 are fixed to an inside of the vacuum housing 112. The calibration markings 116 are arranged such that they are not directly between the cameras 104 and the object of interest 118. In other words, in some embodiments, each calibration marking 116 has an innermost point with respect to the vacuum chamber 101 that intersects a continuously extending line 220 normal to the wafer chuck 114, wherein the continuously extending line 220 does not intersect the object of interest 118 or the carrier wafer 102.

In some embodiments, the camera 104 is configured to measure the time it takes between emitting the radiation and receiving the reflected radiation in order to determine the distance that the object of interest 118 is from the camera 104. Many radiation pulses are emitted and received by the emitter 208 and the sensor 206, respectively, such that a 3D depth profile of the entire area of the object of interest 118 may be collected. In some embodiments, the camera 104 converts the time into a distance and then wirelessly sends the distance data to the wireless receiver 150 outside of the vacuum housing 112, whereas in other embodiments, the camera 104 sends the time data to the wireless receiver 150 outside of the vacuum housing 112 for processing using software. In some embodiments, an equation to convert the time between the emission of the radiation and the receiving of the radiation, t, to a distance, d, may be, $d=\frac{1}{2}t \cdot c$, where c is the speed of light. The wireless receiver 150 may compile many depth data points, or image data points, collected by each camera 104 to produce a 3D image or 3D depth profile of the object of interest 118, to diagnose any defects of the feature under operating conditions. The operating conditions may be vacuum conditions, temperature conditions, pressure conditions, or other parameters of the vacuum chamber 101.

Figure 2B:
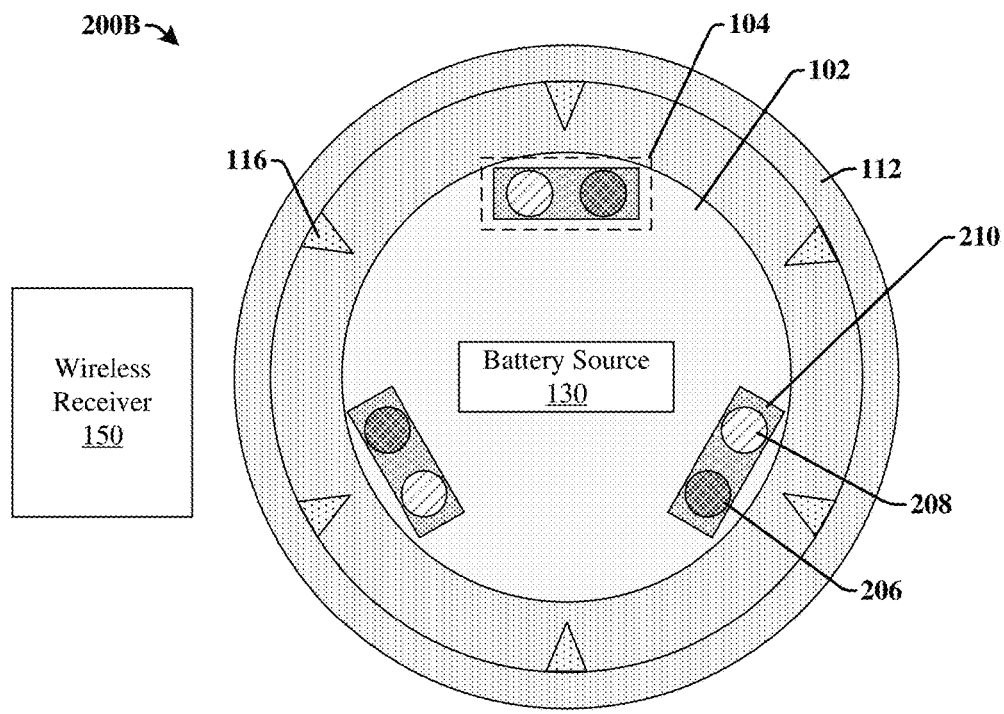

FIG. 2B illustrates a top-view 200B of some embodiments of a carrier wafer comprising cameras within a vacuum chamber. The top-view 200B of FIG. 2B corresponds to the cross-sectional view 200A of FIG. 2A along line AA'.

In some embodiments, a battery source 130 as described in the top-view 100B of FIG. 1B may also be on the carrier wafer 102 in the top-view 200B of FIG. 2B. In some embodiments, from the top-view 200B, the emitter 208 and the sensor 206 may exhibit a circular shape. From the top-view 200B, there are six calibration markings 116 for three cameras 104. The ratio of the total number of calibration markings 116 to the total number of cameras 104 is many-to-one, or in other words, greater than one, such that each camera 104 can use multiple calibration markings 116 to verify calibration. For example, in some embodiments, each camera 104 uses 3 or more calibration markings 116 to conduct calibration. In other embodiments, each camera 104 may use 2 calibration markings 116 to conduct calibration. In some embodiments, the calibration markings 116 have a triangular shape from the top-view 200B, but it will be appreciated that the calibration markings 116 may exhibit other shapes. The calibration markings 116 are fixed to the vacuum housing 112 and in some embodiments, are evenly spaced apart from one another. In other embodiments, the calibration markings 116 may not be evenly spaced apart from one another.

Further, as described regarding the cameras 104 in the top-view 100B of FIG. 1B, in some embodiments, the cameras 104 may take on a variety of arrangements on the carrier wafer 102 to wirelessly capture a desired feature within the vacuum housing 112 under vacuum conditions.

Figure 2C:
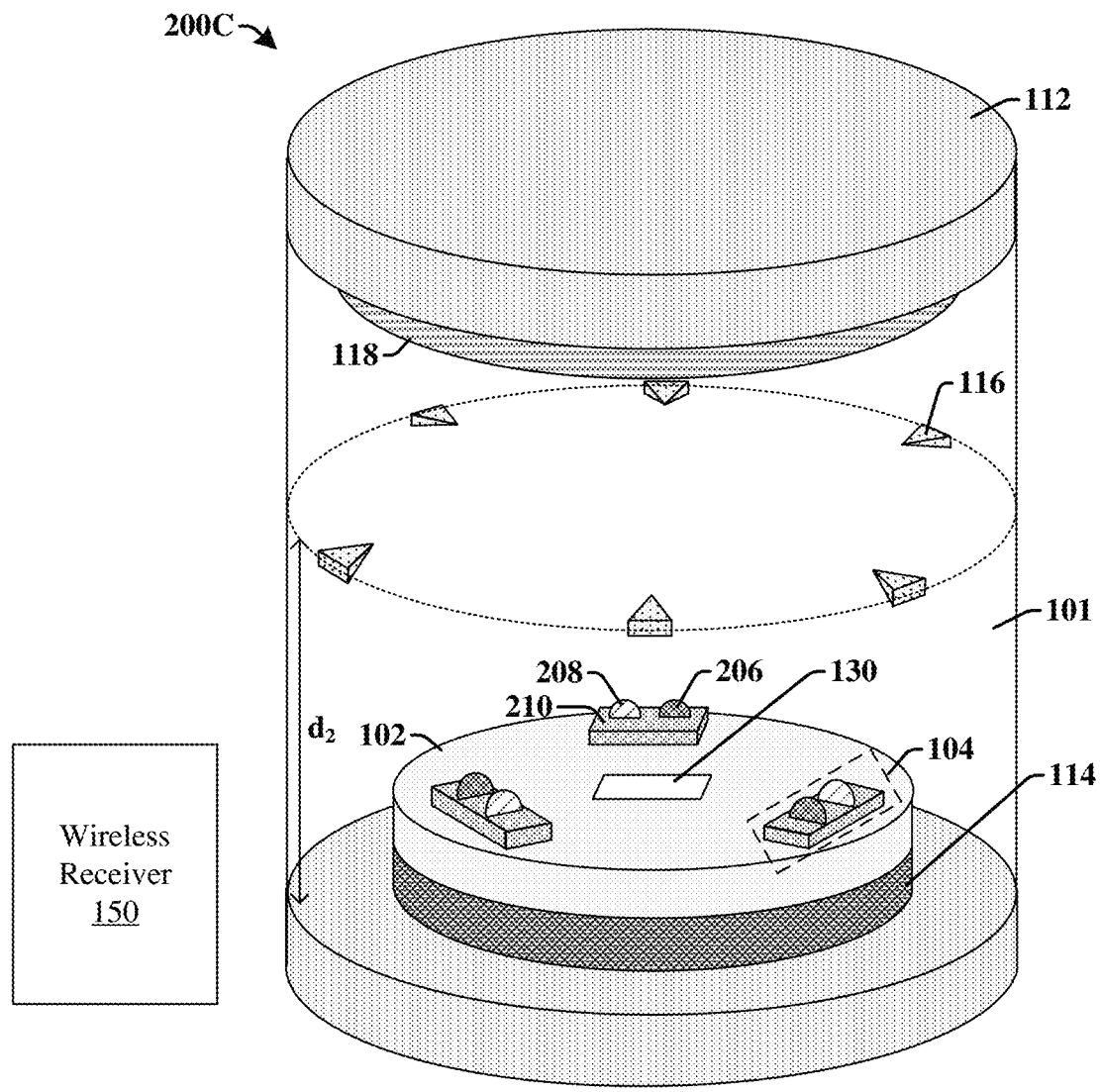

FIG. 2C illustrates a perspective view 200C of some embodiments of a carrier wafer comprising cameras within a vacuum chamber. The perspective view 200C corresponds to the cross-sectional view 200A of FIG. 2A.

The process tool in the perspective view 200C of FIG. 2C includes similar features as the process tool in the perspective view 100C of FIG. 1C, except that the cameras 104 of FIG. 2C comprise a sensor 206 and an emitter 208 and that calibration markings 116 are fixed to the vacuum housing 112. In some embodiments, from the perspective view 200C, the emitter 208 and the sensor 206 exhibit a spherical shape. In some embodiments, the calibration markings 116 are used to calibrate the cameras 104 such that the cameras 104 can collect 3D depth profile of the object of interest 118 from a same level of reference. Thus, the calibration markings 116 are at a known location in the vacuum housing 112. For example, in some embodiments, the calibration markings 116 are each at a second distance $d_2$ from a lower surface of the vacuum housing 112. Thus, each calibration marking 116 is arranged at a same level or, in other words, on a same plane in the vacuum chamber 101 such that each camera 104 is calibrated to the same reference level. The calibration markings 116 are also arranged on a plane that is between the cameras 104 and the object of interest 118.

Figure 3A:
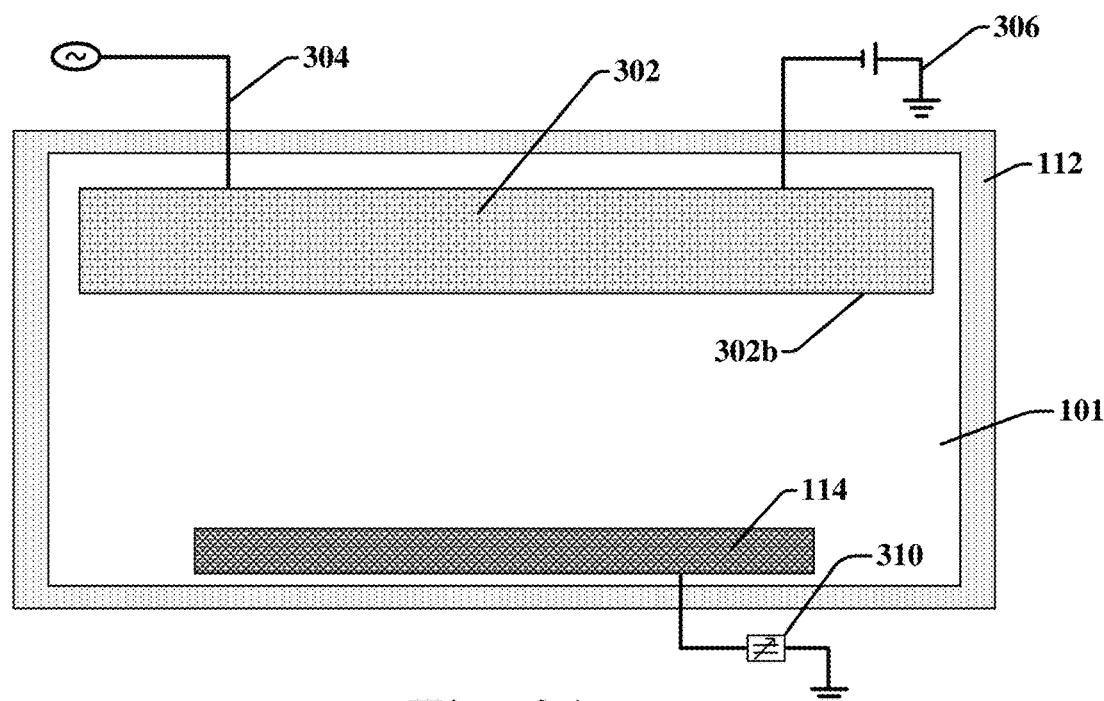
FIGS. 3A and 3B illustrate cross-sectional views of some embodiments of a target for a physical vapor deposition process.

FIG. 3A illustrates a cross-sectional view 300A of some embodiments of a vacuum chamber comprising a target for in a physical vapor deposition (PVD) process.

In some embodiments, a target 302 is used as the object of interest (e.g. the object of interest 118 of FIG. 1A) in the vacuum chamber (e.g. the vacuum chamber 101), which may be a PVD chamber. Material from the target 302 may be vaporized and redeposited on a wafer by physical bombardment. The wafer may rest on the wafer chuck 114. In some embodiments, a voltage bias is applied to the wafer chuck 114 using a variable capacitor 310, which in turn applies a bias to the wafer. In some embodiments, the target 302 may have a bottom surface 302b that is substantially planar and that faces the wafer chuck (114 of FIG. 1A) in the vacuum chamber (101 of FIG. 1A). In some embodiments, a continuous direct current (DC) voltage 306 is applied to the target 302 to facilitate PVD. For example, in some embodiments, using the variable capacitor 310, the wafer chuck 114 and the target 302 are biased so as material from the target 302 is electrostatically attracted to a wafer held by the wafer chuck 114. In some embodiments, radio frequency (RF) voltages 304 are also applied to the target 302 to further control the bias and prevent charge build-up on the target 302.

Figure 3B:
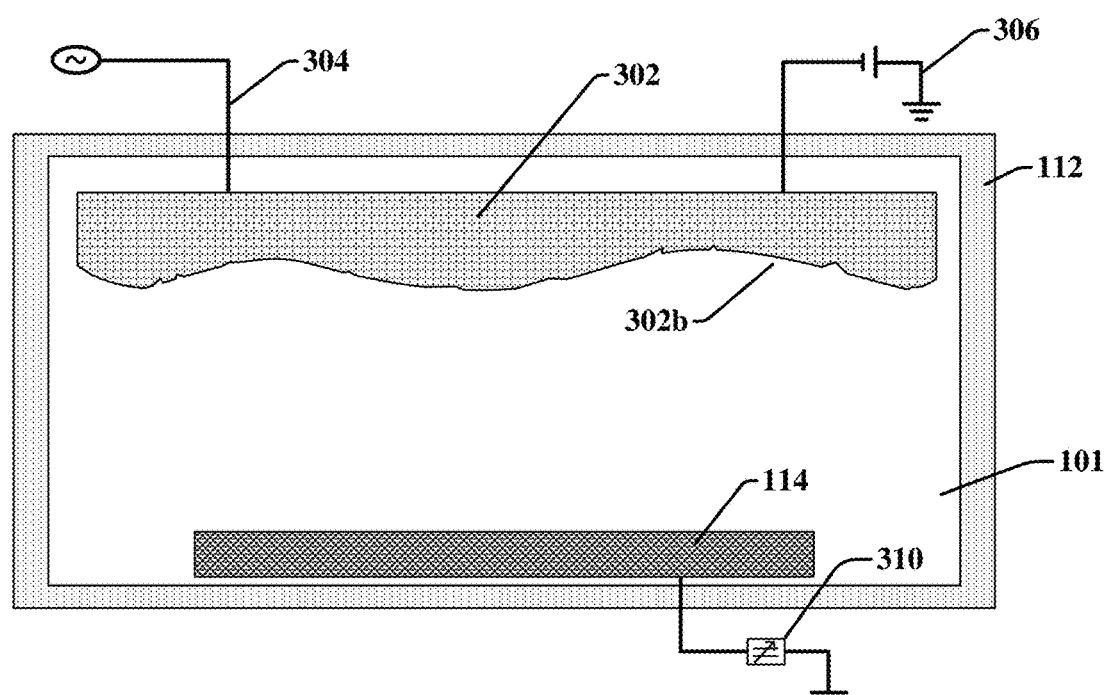

FIG. 3B illustrates a cross-sectional view 300B of some embodiments of a vacuum chamber comprising a target that is damaged after usage in a PVD process.

The cross-sectional view 300B of FIG. 3B illustrates the same features as the cross-sectional view 300A of FIG. 3A, except that the bottom surface 302b of the target 302 comprises damage. In some embodiments, due to the vacuum conditions of the vacuum chamber 101, the variable capacitor 310, the continuous DC voltage 306, the RF voltage 304, and/or other parameters (e.g., pressure, temperature, etc.) of the PVD process, the target 302 may comprise damage on the bottom surface 302b. For example, damage to the bottom surface 302b of the target 302 may include erosion, peeling, and cracking. The damage may cause the target 302 to have a non-uniform thickness, may lead to arcing, and/or may lead to some other failure condition. In some embodiments, when damage to the target 302 is present, the deposited film may not be uniform. In order to identify a cause of damage to the target 302, the target 302 should be analyzed under vacuum conditions. Then, the parameters of the PVD process may be adjusted to prevent future damage of the target 302.

Figure 4A:
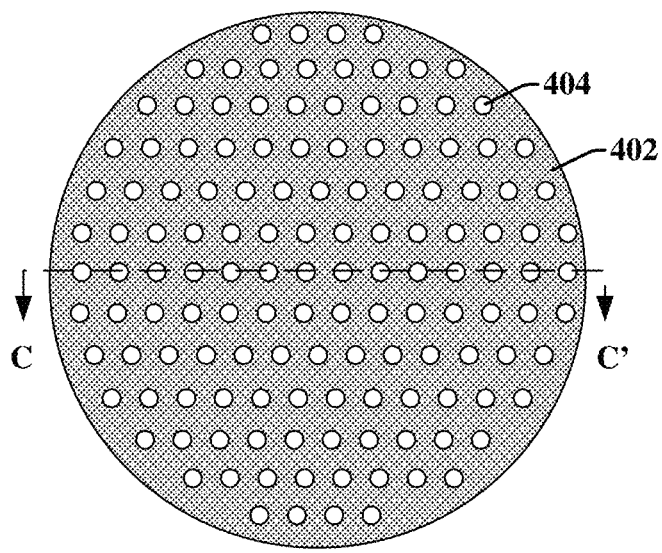
FIGS. 4A, 4B and 4C illustrate various views of some embodiments of a shower head used in a chemical vapor deposition process.

FIG. 4A illustrates a top-view 400A of some embodiments of a shower head used in chemical vapor deposition (CVD) processes.

In some embodiments, a shower head 402 is used as the object of interest (e.g. 118 of FIG. 1A) in the vacuum chamber (e.g. 101 of FIG. 1A), which may be a CVD chamber. The shower head 402 comprises multiple pores 404 to release gases into the vacuum chamber (101 of FIG. 1A) for deposition of a film onto a wafer. The pores 404 of the shower head 402 face the wafer chuck (114 of FIG. 1A).

Figure 4B:
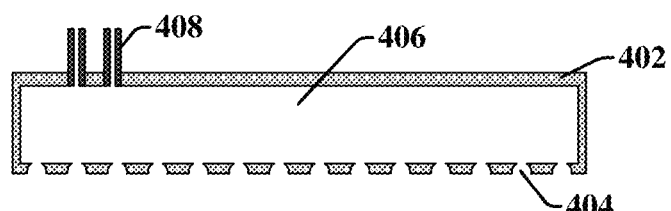

FIG. 4B illustrates a cross-sectional view 400B of some embodiments of the shower head of FIG. 4A along line CC'.

In some embodiments, gas reactants (i.e., precursors) enter a cavity 406 of the shower head 402 via input lines 408. The gas reactants then leave the cavity 406 and enter the vacuum chamber (101 of FIG. 1A) through the pores 404 for CVD. The pores 404 may evenly distribute the gaseous reactants for uniform deposition of a film onto a wafer.

Figure 4C:
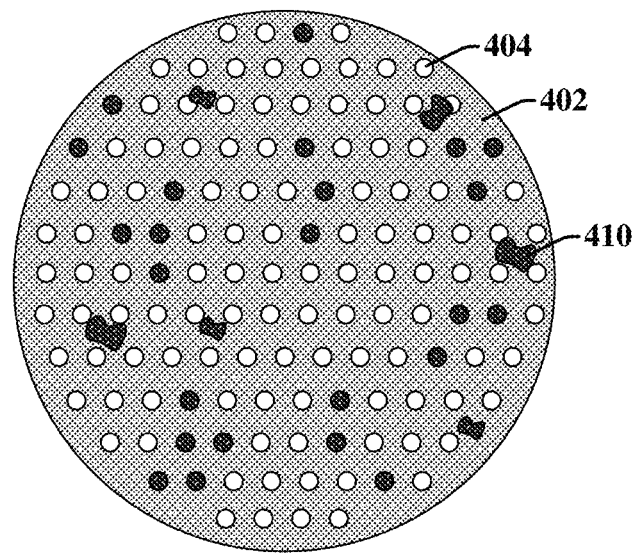

FIG. 4C illustrates a top-view 400C of some embodiments of a shower head that is damaged after usage in a CVD chamber.

The top-view 400C of FIG. 4C illustrates the same features as the top-view 400A of FIG. 4A, with the addition of residue 410 on the shower head 402. In some embodiments, due to parameters of the CVD process, residue 410 may build up on the shower head 402. In some embodiments, the residue 410 may clog some of the pores 404 on the shower head 402. When the pores 404 are clogged, the distribution of the gaseous reactants is not even, and a non-uniform deposition of a film onto a wafer may occur. In order to identify a cause of damage to the residue 410 on the shower head 402, the shower head 402 may be analyzed under vacuum conditions and/or other operating conditions by the cameras 104 (see, e.g., FIG. 1A). Then, the parameters of the CVD process may be adjusted to prevent residue 410 on the shower head 402.

Figure 6:
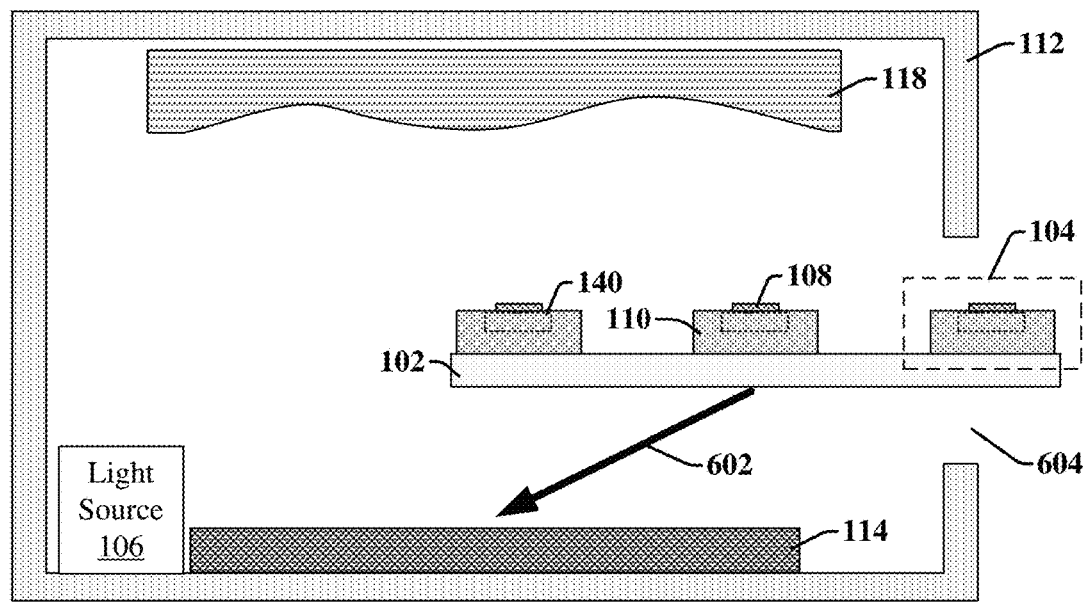
Figure 7:
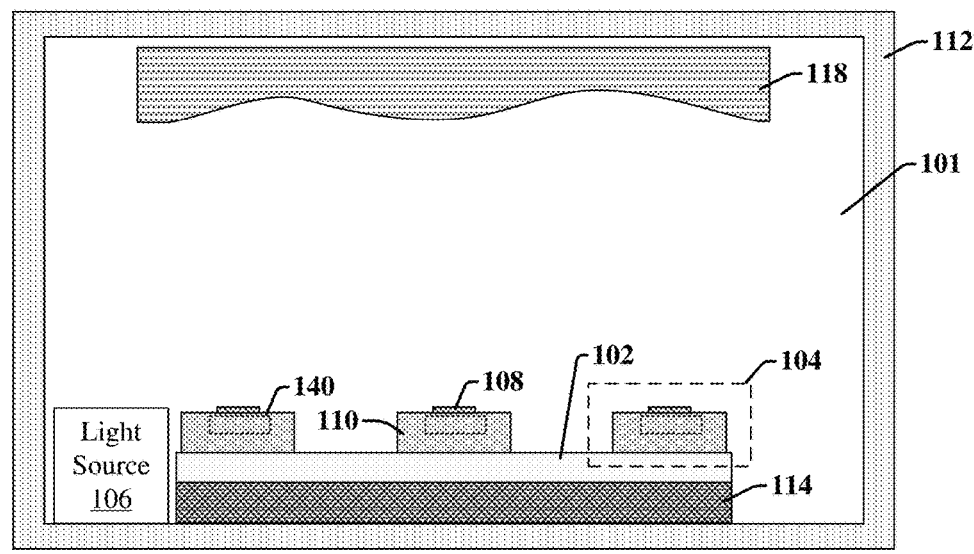
Figure 8A:
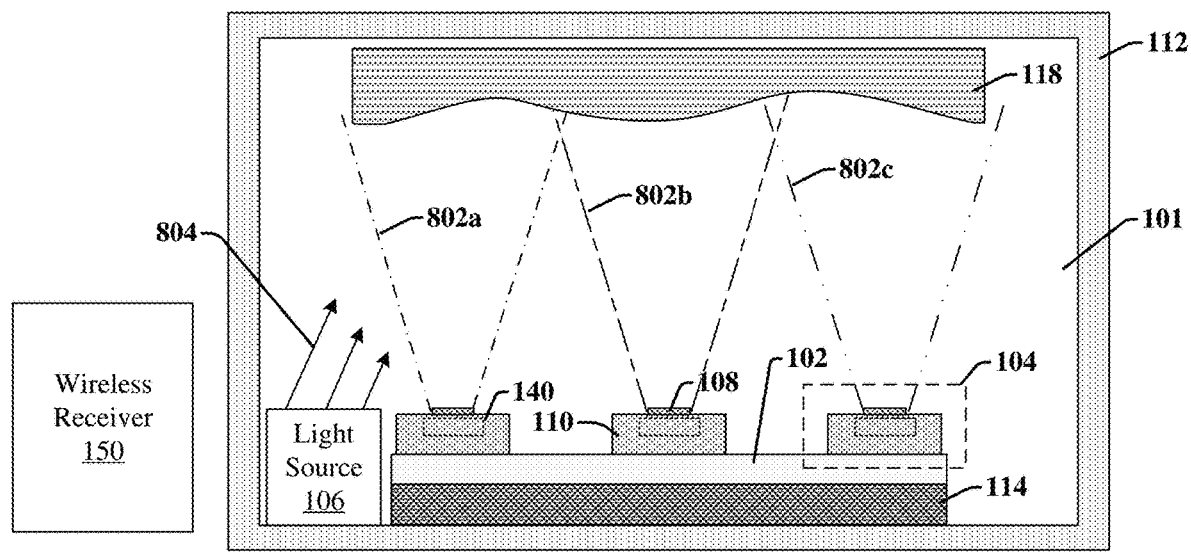
Figure 8B:
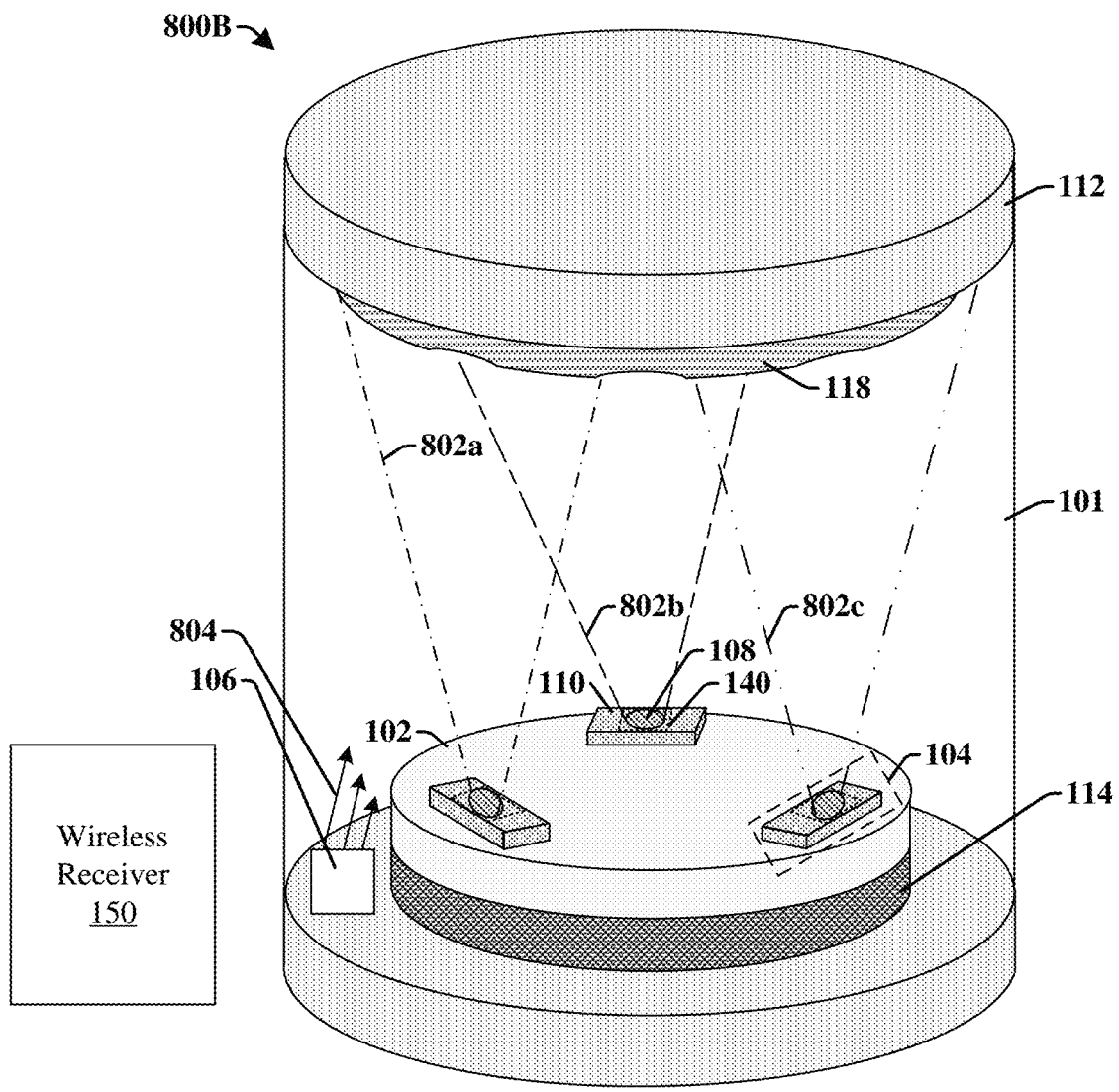

FIGS. 5, 6, 7, and 8A illustrate cross-sectional views 500, 600, 700, and 800A, respectively, and FIG. 8B illustrates a perspective view 800B, of some embodiments of a method of capturing images inside of a vacuum housing under operating conditions (e.g., vacuum conditions, temperature conditions, pressure conditions, etc.). Such a method may, for example, correspond and/or relate to a method of use for embodiments of FIGS. 1A-1C. Although FIGS. 5, 6, 7, 8A, and 8B are described in relation to a method, it will be appreciated that the structures disclosed in FIGS. 5, 6, 7, 8A, and 8B are not limited to such a method, but instead may stand along as structures independent of the method.

Figure 5:
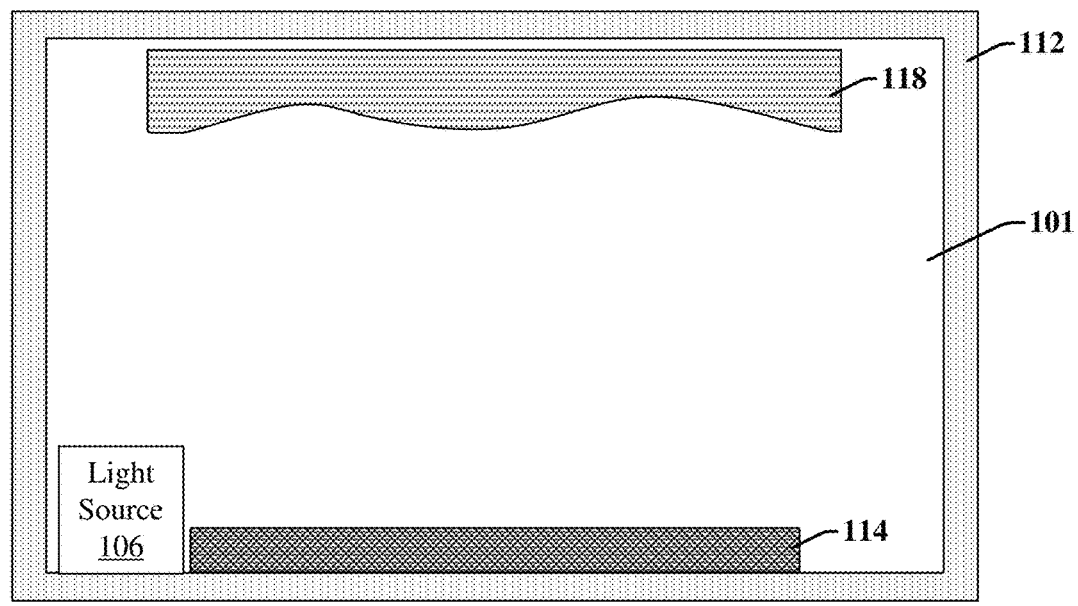
FIGS. 5, 6, 7, 8A, and 8B illustrate cross-sectional and perspective views of some embodiments of a method of taking 2D images of a vacuum chamber under vacuum conditions.

As shown in the cross-sectional view 500 of FIG. 5, a vacuum housing 112 encloses a wafer chuck 114, a light source 106, and an object of interest 118. The vacuum housing 112 defines a vacuum chamber 101. In some embodiments, the vacuum chamber 101 may be a chamber for deposition (e.g., CVD, PVD, etc.), etching, heating (e.g., annealing), implantation, or another process in semiconductor manufacturing that use a vacuum chamber. The light source 106 may be within the vacuum housing 112 in some embodiments, whereas in other embodiments, the light source 106 may not be within the vacuum housing 112. For example, in some embodiments, the light source 106 may not be needed and hence omitted. In some embodiments, the light source 106 may be on a different feature within the vacuum housing 112 (see, light source 106 of FIG. 1A). In some embodiments, the wafer chuck 114 is substantially centered beneath the object of interest 118. In some embodiments, the object of interest 118 may have a bottom surface that is not planar due to the presence of defects on the object of interest 118, such as residue build-up, erosion, peeling, and cracking. In other embodiments, the object of interest 118 may have a bottom surface that is substantially uniform and defect-free, which may, in some embodiments, be indicated by the bottom surface being planar.

As shown in the cross-sectional view 600 of FIG. 6, a carrier wafer 102 is loaded 602 inside of the vacuum housing 112 through an opening 604 in the vacuum housing 112. The carrier wafer 102 may have a top surface that comprises cameras 104 and the bottom surface of the carrier wafer 102 may be loaded 602 onto the wafer chuck 114. In some embodiments, the cameras 104 comprise an image sensor 140 and a lens 108 within a camera housing 110. Further, in some embodiments, the carrier wafer 102 with the cameras 104 are sized to be similar to a semiconductor wafer on which a layer may be deposited in the vacuum housing 112. Therefore, the carrier wafer 102 can be loaded 602 into the vacuum chamber 101 using the same transportation device as the semiconductor wafer and the carrier wafer 102 properly fits on the wafer chuck 114.

As shown in the cross-sectional view 700 of FIG. 7, the carrier wafer 102 is secured onto the wafer chuck 114. In some embodiments, the wafer chuck 114 is an electrostatic chuck, and the carrier wafer 102 is electrostatically held onto the wafer chuck 114. Further, the vacuum housing 112 is sealed to define the vacuum chamber 101 and vacuum conditions and/or other operating conditions are applied inside of the vacuum housing 112.

As shown in the cross-sectional view 800A of FIG. 8A, the light source 106 is wireless controlled to emit light 804 towards the object of interest 118, and the cameras 104 are each wirelessly controlled to capture image data 802a, 802b, 802c of the object of interest 118. The cameras 104 may then send the image data to a wireless receiver 150 that is outside of the vacuum housing 112 for image data processing. For example, in some embodiments, the wireless receiver 150 receives multiple overlapping images of the object of interest 118 and integrates the multiple overlapping images to produce a final, single image of the object of interest 118 under vacuum conditions. In some embodiments, the image sensors 140 of the cameras 104 are CMOS image sensors and produce 2D images of the object of interest 118.

FIG. 8B illustrates the perspective view 800B that corresponds to the cross-sectional view 800A of FIG. 8A. In some embodiments, the cameras 104 each capture images 802a, 802b, 802c simultaneously. The number of cameras 104 and the arrangement of the cameras 104 are each designed to capture an image showing the object of interest 118, or a portion of the object of interest 118, inside of the vacuum housing 112. For example, in the illustrated embodiment, three cameras 104 are used to capture the entire area of the object of interest 118.

After the cameras 104 capture images 802a, 802b, 802c, the carrier wafer 102 may be removed from the vacuum chamber 101 and production may proceed. By quickly wirelessly checking the condition of the vacuum chamber 101 under vacuum conditions and/or other operating conditions, defects within the vacuum chamber 101 may be caught early and fixed.

Figure 9:
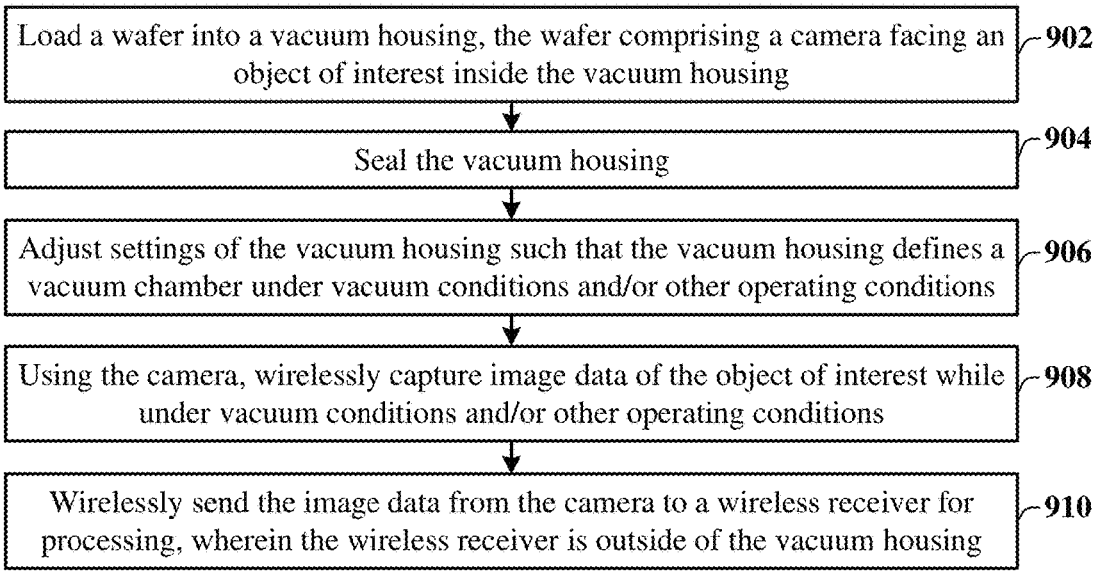
FIG. 9 illustrates a flow diagram of some embodiments of the method in FIGS. 5, 6, 7, 8A, and 8B.

FIG. 9 illustrates a flow diagram of some embodiments of a method 900 corresponding to FIGS. 5, 6, 7, 8A, and 8B.

While method 900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 902, a wafer is loaded into a vacuum housing. The wafer comprises a camera facing an object of interest inside the vacuum housing. FIG. 6 illustrates a cross-sectional view 600 of some embodiments corresponding to act 902.

At act 904, the vacuum housing is sealed.

At act 906, the settings of the vacuum chamber are adjusted such that the vacuum housing defines a vacuum chamber under vacuum conditions and/or other operating conditions. FIG. 7 illustrates a cross-sectional view 700 of some embodiments corresponding to acts 904 and 906.

At act 908, using the camera, image data is wirelessly captured of the object of interest while under vacuum conditions and/or other vacuum conditions.

At act 910, the image data is wirelessly sent from the camera to a wireless receiver for processing, wherein the wireless receiver is outside of the vacuum housing. FIGS. 8A and 8B illustrate a cross-sectional view 800A and a perspective view 800B, respectively, of some embodiments corresponding to acts 908 and 910.

Figure 11:
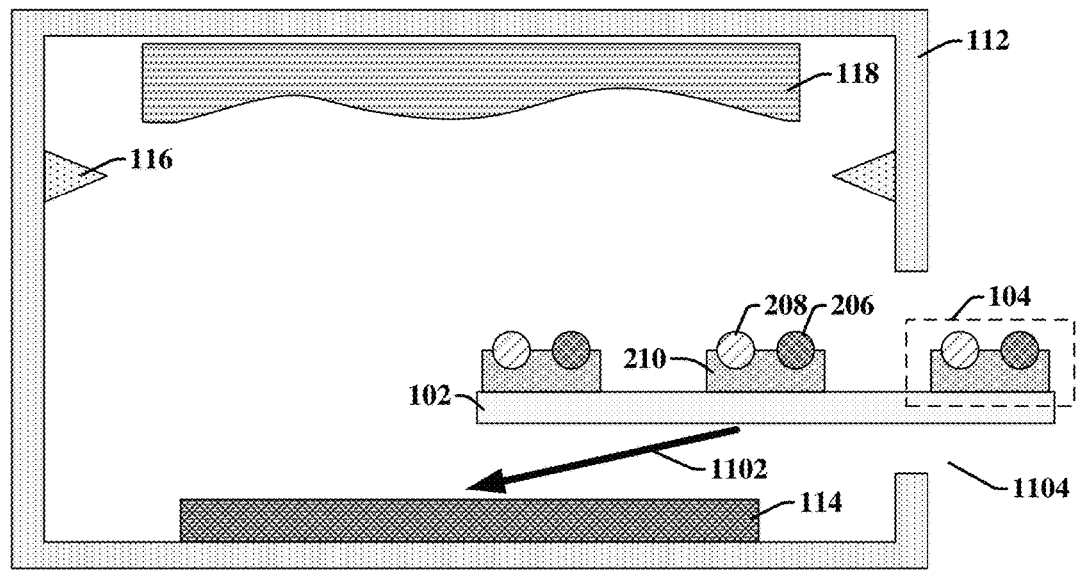
Figure 12:
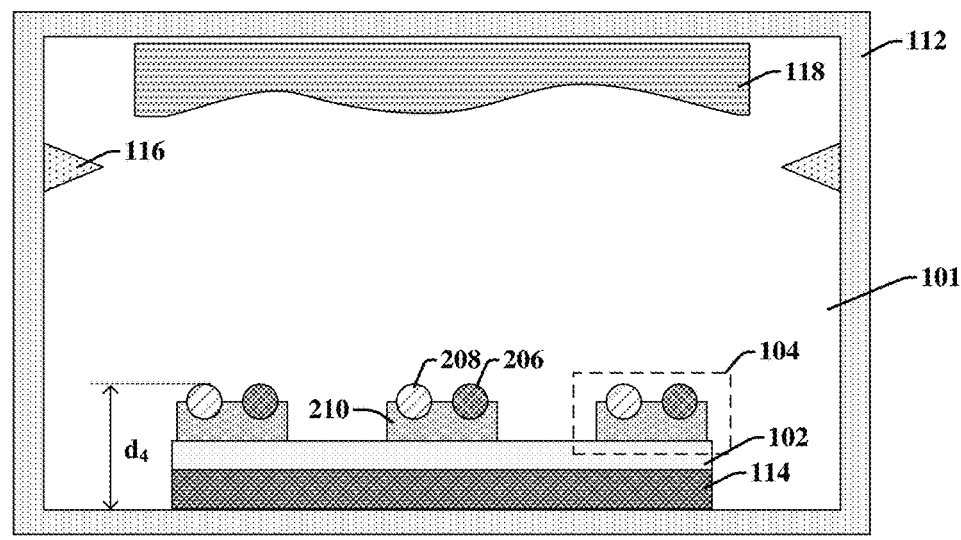
Figure 13A:
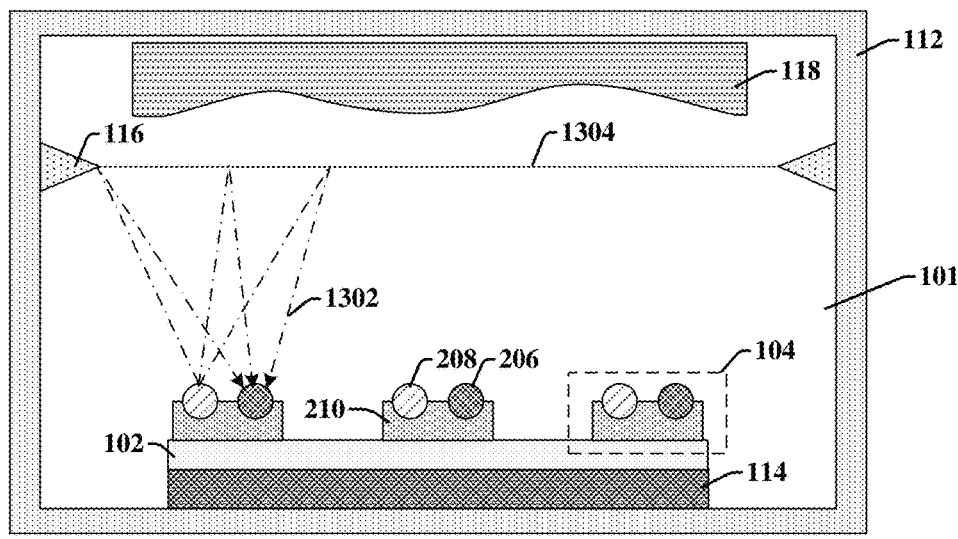
Figure 13B:
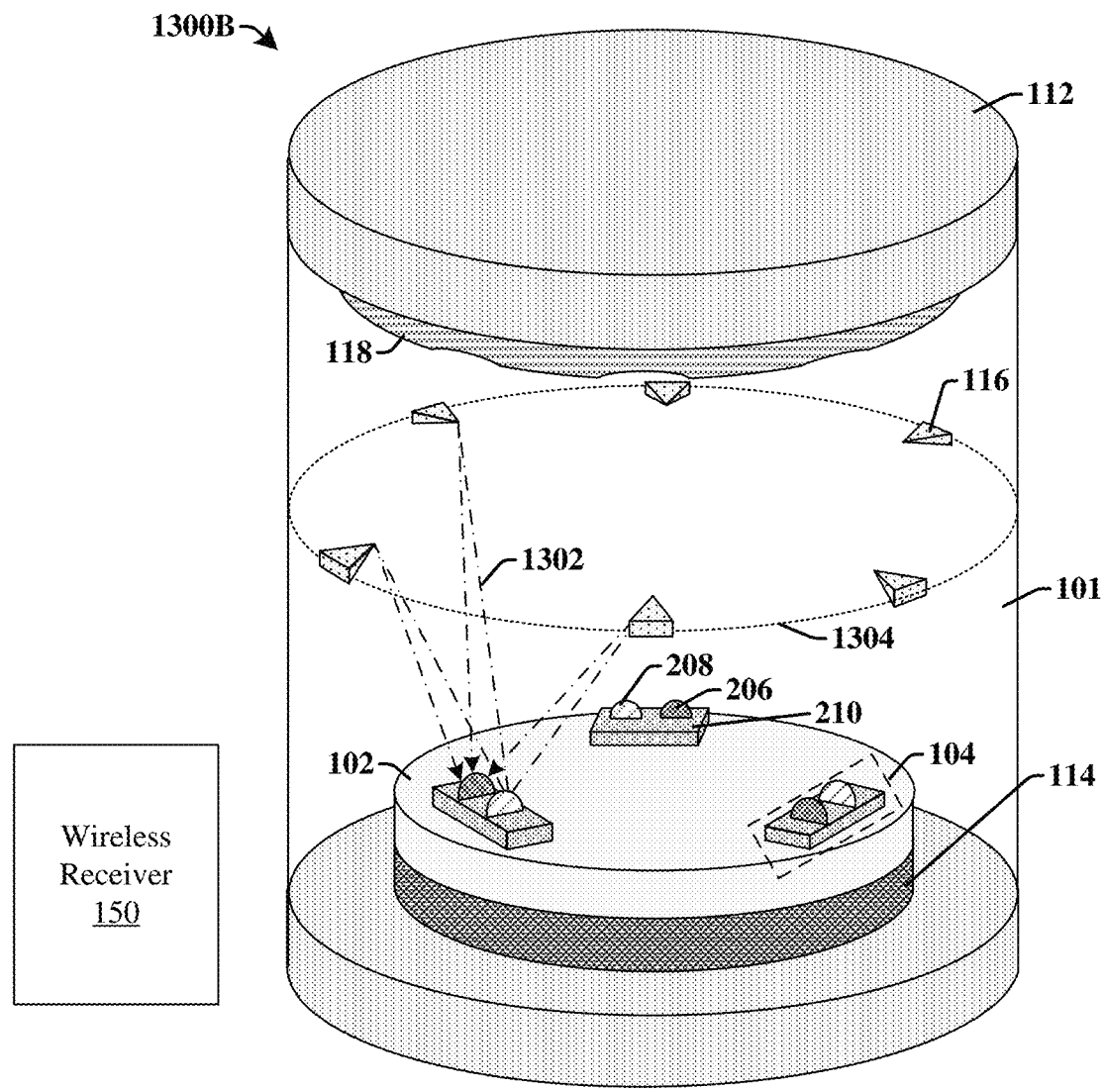
Figure 14A:
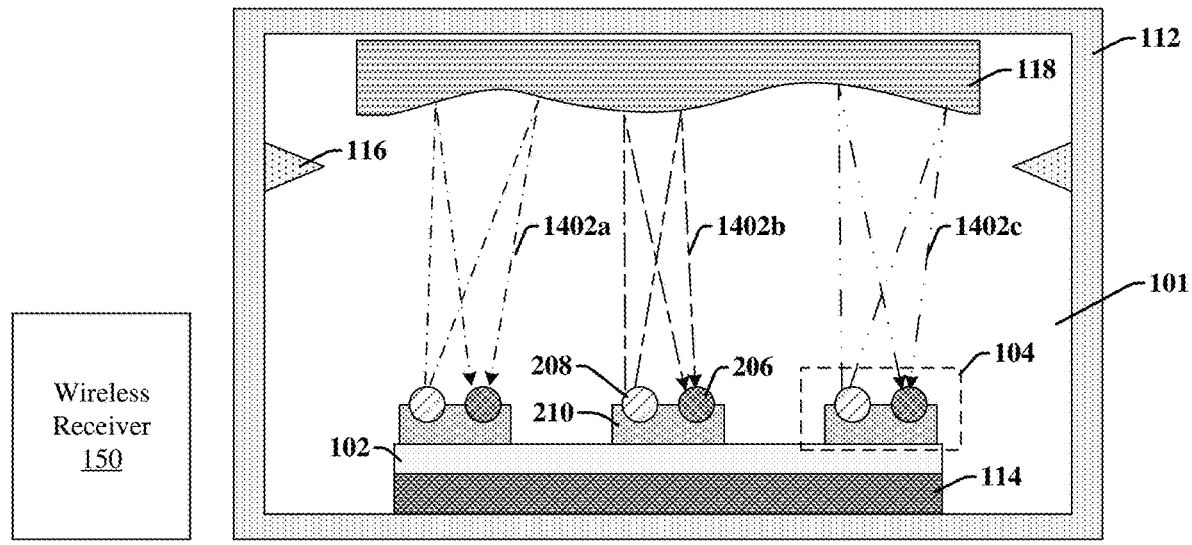
Figure 14B:
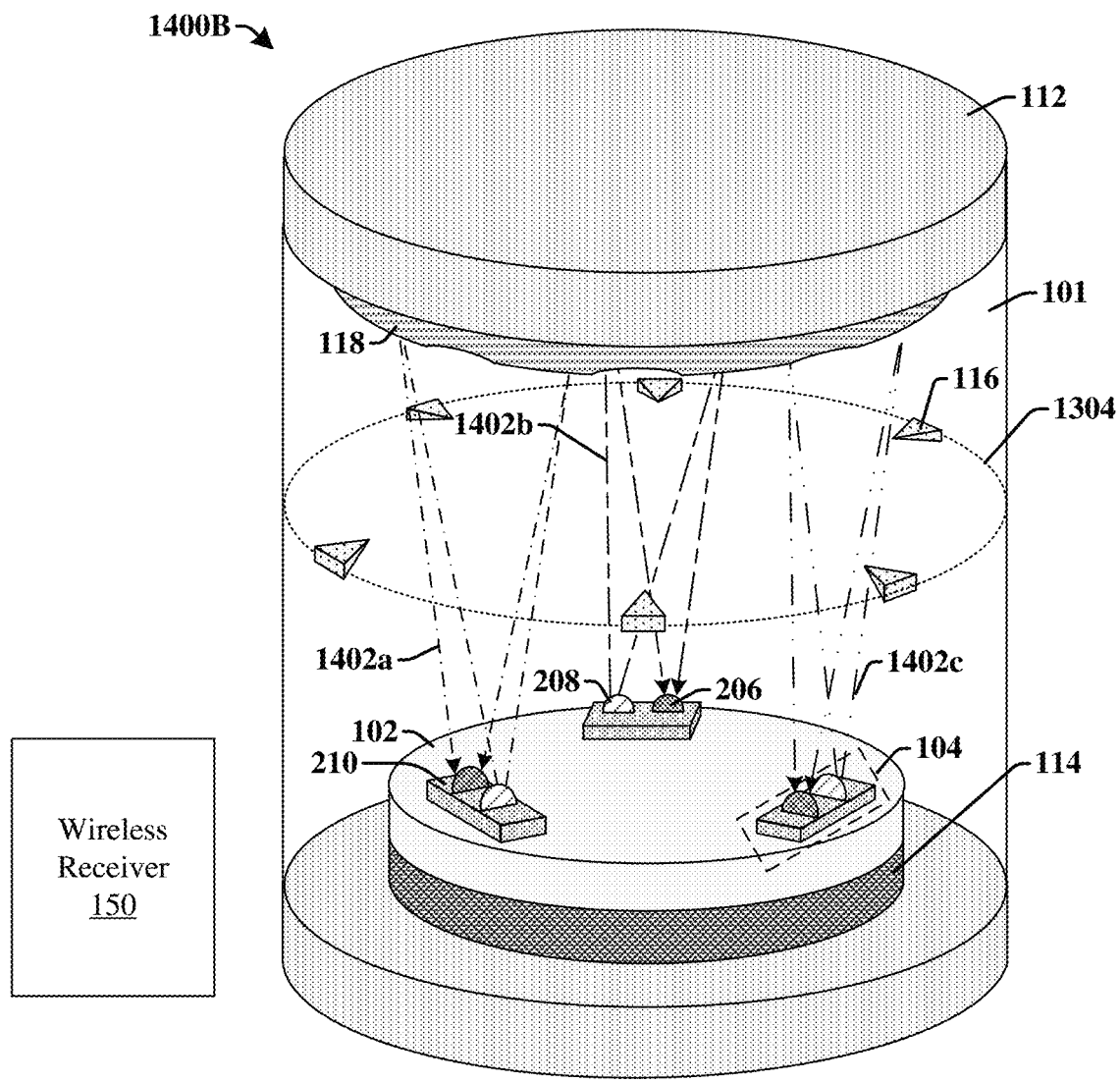

FIGS. 10, 11, 12, 13A, and 14A illustrate cross-sectional views 1000, 1100, 1200, 1300A, and 1400A respectively, and FIGS. 13B and 14B illustrate perspective views 1300B and 1400B, respectively, of some embodiments of a method of capturing images inside of a vacuum housing under vacuum conditions. Such method may, for example, correspond and/or relate to a method of use for embodiments of FIGS. 2A-2C. Although FIGS. 10, 11, 12, 13A, 13B, 14A, and 14B are described in relation to a method, it will be appreciated that the structures disclosed in FIGS. 10, 11, 12, 13A, 13B, 14A, and 14B are not limited to such a method, but instead may stand along as structures independent of the method.

Figure 10:
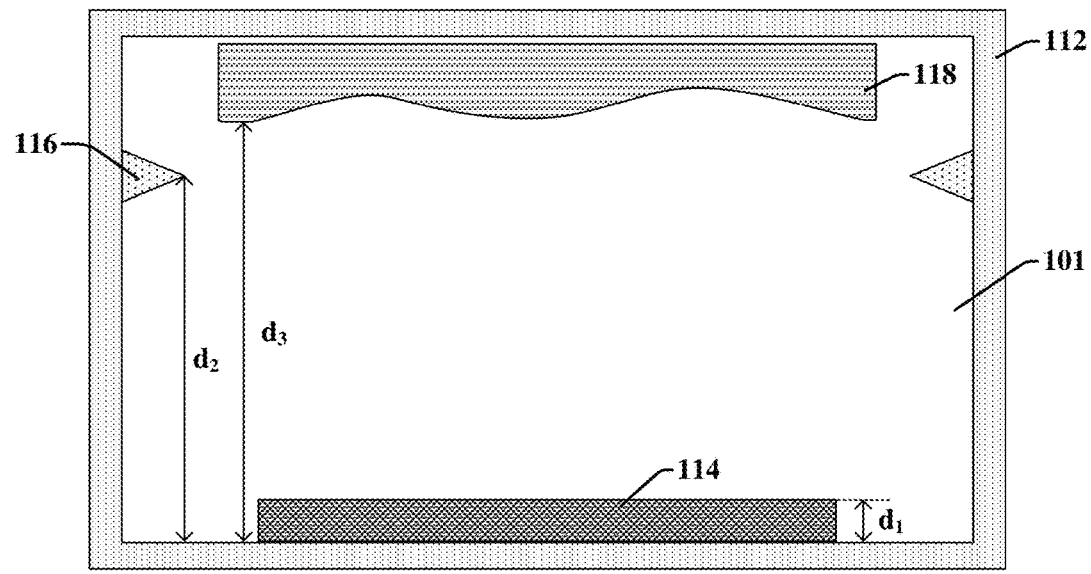
FIGS. 10, 11, 12, 13A, 13B, 14A, and 14B illustrate cross-sectional and perspective views of some embodiments of a method of taking 3D images of a vacuum chamber under vacuum conditions.

As shown in the cross-sectional view 1000 of FIG. 10, a vacuum housing 112 encloses a wafer chuck 114, an object of interest 118, and calibration markings 116. The object of interest 118 may be a material for film deposition or may be some other feature inside the vacuum housing 112. The vacuum housing 112 defines a vacuum chamber 101. In some embodiments, the vacuum chamber 101 may be a chamber for deposition (e.g., CVD, PVD, etc.), etching, heating (e.g., annealing), implantation, or another process in semiconductor manufacturing that use a vacuum chamber 101. In some embodiments, the wafer chuck 114 is substantially centered beneath the object of interest 118. In other embodiments, the object of interest 118 may be off-center from the wafer chuck 114.

In some embodiments, the calibration markings 116 are fixed to an inside of the vacuum housing 112. The calibration markings 116 are arranged at a level between the wafer chuck 114 and the object of interest 118. In other words, the wafer chuck 114 may be at a first distance $d_1$ from a bottom of the vacuum chamber 101; the calibration markings 116 may be at a second distance $d_2$ from the bottom of the vacuum chamber 101 that is greater than the first distance $d_1$; and the object of interest 118 may be at a third distance $d_3$ from the bottom of the vacuum chamber 101 that is greater than the second distance $d_2$.

As shown in the cross-sectional view 1100 of FIG. 11, a carrier wafer 102 is loaded 1102 inside of the vacuum housing 112 through an opening 1104 in the vacuum housing 112. The carrier wafer 102 may have a top surface that comprises cameras 104 and a bottom surface of the carrier wafer 102 may be loaded 1102 onto the wafer chuck 114. In some embodiments, the cameras 104 are time of flight (ToF) cameras and comprise a sensor 206 and an emitter 208 within a camera housing 210. In some embodiments, the carrier wafer 102 with the cameras 104 are sized to be similar to a semiconductor wafer on which a layer may be deposited in the vacuum housing 112. Therefore, the carrier wafer 102 can be loaded 1102 into the vacuum chamber 101 using the same transportation device as the semiconductor wafer and the carrier wafer 102 properly fits on the wafer chuck 114.

As shown in the cross-sectional view 1200 of FIG. 12, the carrier wafer 102 is secured onto the wafer chuck 114. In some embodiments, the wafer chuck 114 is an electrostatic chuck, and the carrier wafer 102 is electrostatically held onto the wafer chuck 114. Further, the vacuum housing 112 is sealed to define the vacuum chamber 101 and vacuum conditions and/or other operating conditions are applied inside of the vacuum housing 112. The cameras 104 are arranged at a fourth distance $d_4$ from the bottom of the vacuum chamber 101, the fourth distance $d_4$ being between the first distance $d_1$ and the second distance $d_2$.

As shown in the cross-sectional view 1300A of FIG. 13A, a wireless receiver 150 is located outside of the vacuum housing 112. The cameras 104 each undergo a calibration process 1302 under the vacuum conditions. In some embodiments, each of the calibration markings 116 are arranged at a same level as one another, or in other words on a same plane in the vacuum chamber 101, as illustrated by a leveling line 1304. The calibration process 1302 involves the emitter 208 emitting radiation towards the calibration markings 116 and the sensor 206 receiving the reflected radiation. The cameras 104 each undergo the calibration process 1302, and each camera 104 calibrates to more than one calibration markings 116 for a more precise and accurate calibration process 1302. The cameras 104 measure the time it takes for the radiation emission at the emitter 208 to reflect off the calibration markings 116 back to the sensor 206. Each calibration marking 116 is at a known distance from each camera 104. In some embodiments, the cameras 104 each convert the time data from the calibration markings 116 into measured distances to determine any adjustments in measurement needed based on a comparison of the measured distances to the known distances. In other embodiments, the cameras 104 send the time data to the wireless receiver 150, and the wireless receiver 150 processes the time data. Nevertheless, calibration process 1302 of the cameras 104 is conducted under vacuum conditions and/or other operating conditions.

FIG. 13B illustrates the perspective view 1300B that corresponds to the cross-sectional view 1300A of FIG. 13A. In some embodiments, each camera 104 uses more than one calibration marking 116 for to conduct a precise and accurate calibration process 1302. For example, in FIG. 13B, one of the cameras 104 uses three calibration markings 116 for the calibration process 1302. In some embodiments, some of the calibration markings 116 may be used for more than one camera 104, whereas in other embodiments, each of the calibration markings 116 are not shared amongst the cameras 104. Nevertheless, the ratio of the total number of calibration markings 116 to the total number of cameras 104 is many-to-one, or in other words, greater than one, such that each camera 104 can use multiple calibration markings 116 to assure that the calibration process 1302 is precise and accurate.

Further, in some embodiments, each camera 104 may undergo the calibration process 1302 at separate, non-overlapping times. For example, as illustrated in FIG. 13B, a first one of the cameras 104 is undergoing the calibration process 1302, while the other two cameras 104 are not. Then, a second one of the cameras 104 will undergo the calibration process 1302 while the other two cameras 104 are not. Lastly, a third one of the cameras 104 will undergo the calibration process 1302 while the other two cameras 104 are not. In other embodiments (not shown), the cameras 104 may undergo the calibration process 1302 simultaneously.

As shown in the cross-sectional view 1400A of FIG. 14A, in some embodiments, each of the cameras 104 collect image data 1402a, 1402b, 1402c of the object of interest 118 in the vacuum chamber 101 under vacuum conditions and/or other operating conditions. In some embodiments, the cameras 104 collect image data 1402a, 1402b, 1402c simultaneously. Each camera 104 collects image data 1402a, 1402b, 1402c of an area of the object of interest 118 by emitting many radiation pulses by the emitter 208 and determining the time it takes to receive the reflected radiation pulses at the sensor 206. Together, the cameras 104 collect image data 1402a, 1402b, 1402c over the entire area of the object of interest 118. The image data may comprise time data, distance data, or parameters of the object of interest 118. For example, similar to the calibration process (1302 of FIG. 13A), in some embodiments, the cameras 104 each convert the time data into distances, and then wirelessly send the distances to the wireless receiver 150 for processing. In other embodiments, the cameras 104 wirelessly send the time data to the wireless receiver 150 for processing. Nevertheless, the cameras 104 collect image data 1402a, 1402b, 1402c of the object of interest 118 and wirelessly send the image data to the wireless receiver 150. The wireless receiver 150 then processes the image data to produce a 3D profile of the object of interest 118.

FIG. 14B illustrates the perspective view 1400B that corresponds to the cross-sectional view 1400A of FIG. 14A. In some embodiments, the calibration markings 116 are arranged such that they do not interfere in the collection of image data 1402a, 1402b, 1402c. After the cameras 104 collect image data 1402a, 1402b, 1402c, the carrier wafer 102 may be removed from the vacuum chamber 101 and production may proceed. In some embodiments, the carrier wafer 102 may be removed from the vacuum chamber 101 before the wireless receiver 150 is done processing the image data, whereas in other embodiments, the carrier wafer 102 may be removed after the wireless receiver is done processing the image data. By quickly wirelessly checking the condition of the vacuum chamber 101 under vacuum conditions and/or other operating conditions with the cameras 104, any identified defects within the vacuum chamber 101 may be caught early and fixed.

Figure 15:
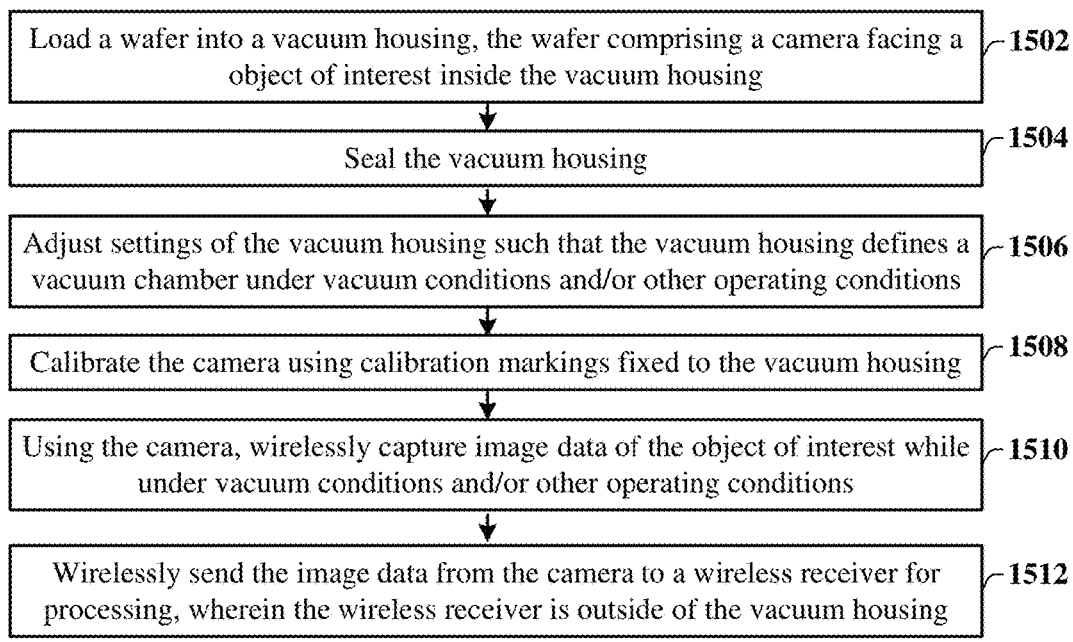
FIG. 15 illustrates a flow diagram of some embodiments of the method in FIGS. 10, 11, 12, 13A, 13B, 14A, and 14B.

FIG. 15 illustrates a flow diagram of some embodiments of a method 1500 corresponding to FIGS. 10, 11, 12, 13A, 13B, 14A, and 14B.

While method 1500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1502, a wafer is loaded into a vacuum housing. The wafer comprises a camera facing an object of interest inside the vacuum housing. FIG. 11 illustrates a cross-sectional view 1100 of some embodiments corresponding to act 1502.

At act 1504, the vacuum housing is sealed.

At act 1506, the settings of the vacuum housing are adjusted such that the vacuum housing defines a vacuum chamber under vacuum conditions and/or other operating conditions. FIG. 12 illustrates a cross-sectional view 1200 of some embodiments corresponding to act 1506.

At act 1508, the camera is calibrated using calibration markings fixed to the vacuum housing. FIGS. 13A and 13B illustrate a cross-sectional view 1300A and a perspective view 1300B, respectively, of some embodiments corresponding to act 1508.

At act 1510, using the camera, image data of the object of interest are wirelessly captured while under vacuum conditions and/or other operating conditions.

At act 1512, the image data is wirelessly sent from the camera to the wireless receiver for processing, wherein the wireless receiver is outside of the vacuum housing. FIGS. 14A and 14B illustrate a cross-sectional view 1400A and a perspective view 1400B, respectively, of some embodiments corresponding to acts 1510 and 1512.

Accordingly, in some embodiments, the present disclosure relates to one or more cameras integrated onto a carrier wafer and an associated method to wirelessly take images of the inside of a vacuum chamber while under vacuum conditions and/or other operating conditions to diagnose defects of features within the vacuum chamber.

Accordingly, in some embodiments, the present disclosure relates to a process tool, comprising: a housing defining a vacuum chamber; a wafer chuck in the housing; a carrier wafer on the wafer chuck; a camera integrated on the carrier wafer, wherein the camera faces a top of the housing and is configured to wirelessly capture images of an object of interest within the housing; and a wireless receiver outside the housing and configured to wirelessly receive the images from the camera while the vacuum chamber is sealed.

In other embodiments, the present disclosure relates to a process tool, comprising: a chamber housing defining a vacuum chamber; an object of interest within an upper portion of the vacuum chamber; a wafer chuck within a lower portion of the vacuum chamber; a carrier wafer disposed on the wafer chuck, wherein a top surface of the carrier wafer faces a bottom surface of the object of interest; and a first camera on the carrier wafer and facing the object of interest, wherein the first camera is configured to wirelessly measure parameters of the object of interest.

In yet other embodiments, the present disclosure relates to a method for capturing image data inside a process tool, the method comprising: loading a wafer into a vacuum chamber defined by a vacuum housing, wherein the wafer comprises a camera, the camera integrated on a top surface of the wafer; sealing the vacuum chamber such that the vacuum chamber is under operating conditions; capturing image data inside of the vacuum housing by using the camera wirelessly while under the operating conditions; and sending the image data to a wireless receiver to process the image data, wherein the wireless receiver is outside of the vacuum chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process tool, comprising:
   a housing defining a vacuum chamber;
   a wafer chuck in the housing;
   a carrier wafer on the wafer chuck;
   a structure used for deposition processes arranged at a top of the housing;
   a camera integrated on the carrier wafer, wherein the camera faces the top of the housing and is configured to capture images of the structure used for deposition processes within the housing; and
   a wireless receiver outside the housing and configured to wirelessly receive the images from the camera while the vacuum chamber is sealed.

2. The process tool of claim 1, wherein the structure used for deposition processes comprises a target material for physical vapor deposition.

3. The process tool of claim 1, wherein the structure used for deposition processes is a shower head used for chemical vapor deposition.

4. The process tool of claim 1, wherein the wireless receiver is configured to determine if the structure used for deposition processes comprises defects.

5. The process tool of claim 1, wherein the camera is configured to take a two-dimensional image of the structure used for deposition processes.

6. The process tool of claim 1, further comprising:
   a light source within the housing and arranged below the structure used for deposition processes, wherein the light source is configured to apply light towards the structure used for deposition processes when the camera is configured to capture images.

7. A process tool, comprising:
   a chamber housing defining a vacuum chamber;
   an object of interest within an upper portion of the vacuum chamber;
   a wafer chuck within a lower portion of the vacuum chamber;

a carrier wafer disposed on the wafer chuck, wherein a top surface of the carrier wafer faces a bottom surface of the object of interest;

a first camera on the carrier wafer and facing the object of interest, wherein the first camera is configured to capture images of the object of interest; and a light source within the chamber housing and arranged below the object of interest, wherein the light source is configured to apply light towards the object of interest when the first camera is configured to capture images of the object of interest.

8. The process tool of claim 7, wherein the images of the object of interest indicate whether the object of interest comprises defects.

9. The process tool of claim 7, wherein the first camera comprises a complementary metal oxide semiconductor (CMOS) image sensor configured to capture two dimensional images of the object of interest.

10. The process tool of claim 7, wherein the vacuum chamber is configured to be used for a chemical vapor deposition process.

11. The process tool of claim 7, wherein the vacuum chamber is configured to be used for a physical vapor deposition process.

12. The process tool of claim 7, wherein the first camera is configured to capture images of the object of interest when the chamber housing is under vacuum conditions.

13. The process tool of claim 7, the light source is arranged on the first camera.

14. The process tool of claim 7, further comprising:
a wireless receiver outside the chamber housing and configured to wirelessly receive the images of the object of interest from the first camera while the vacuum chamber is under vacuum conditions.

15. The process tool of claim 7, wherein the vacuum chamber is configured to be used for a deposition process, and wherein the object of interest is a structure used for the deposition process.

16. A method comprising:
loading a wafer into a vacuum chamber defined by a vacuum housing, wherein the wafer comprises a camera, the camera integrated on a top surface of the wafer;

sealing the vacuum chamber such that the vacuum chamber is under operating conditions;

capturing image data inside of the vacuum housing by using the camera wirelessly while under the operating conditions; and sending the image data to a wireless receiver to process the image data, wherein the wireless receiver is outside of the vacuum chamber, wherein the vacuum chamber is configured to be used for a deposition process, and wherein the camera faces a structure used for the deposition process, and wherein processed image data indicates if the structure used for the deposition process comprises defects.

17. The method of claim 16, wherein operating conditions comprise vacuum conditions, temperature conditions, and/or pressure conditions.

18. The method of claim 16, wherein before the wafer is loaded into the vacuum chamber, a processed wafer that underwent the deposition process is removed from the vacuum housing.

19. The method of claim 16, wherein the deposition process is not performed when the wafer is in the vacuum chamber.

20. The method of claim 16, further comprising:
adjusting the operating conditions to prevent further defects from forming on the structure used for the deposition process.

* * * * *